(12) United States Patent
McNulty et al.

(10) Patent No.: US 11,350,797 B2
(45) Date of Patent: Jun. 7, 2022

(54) TOUCH-FREE DISPENSERS

(71) Applicant: GOJO Industries, Inc., Akron, OH (US)

(72) Inventors: John J. McNulty, Broadview Heights, OH (US); Nick E. Ciavarella, Seven Hills, OH (US); Daniel M. Willis, Clinton, OH (US); Aaron D. Marshall, Uniontown, OH (US); Donald R. Harris, Mogadore, OH (US)

(73) Assignee: GOJO Industries, Inc., Akron, OH (US)

( * ) Notice: Subject to any disclaimer, the term of this patent is extended or adjusted under 35 U.S.C. 154(b) by 0 days.

(21) Appl. No.: 16/176,411

(22) Filed: Oct. 31, 2018

(65) Prior Publication Data

US 2019/0133384 A1    May 9, 2019

Related U.S. Application Data

(60) Provisional application No. 62/581,830, filed on Nov. 6, 2017.

(51) Int. Cl.
  *A47K 5/12*    (2006.01)
  *A47K 5/14*    (2006.01)
  *H03K 7/08*    (2006.01)

(52) U.S. Cl.
  CPC .......... *A47K 5/1217* (2013.01); *A47K 5/1202* (2013.01); *A47K 5/1207* (2013.01);
  (Continued)

(58) Field of Classification Search
  CPC .. A47K 5/1217; A47K 5/1202; A47K 5/1207; A47K 5/1211; A47K 5/14; H03K 7/08
  (Continued)

(56) References Cited

U.S. PATENT DOCUMENTS

| | | | | |
|---|---|---|---|---|
| 4,189,067 A | * | 2/1980 | Nottke | B01F 15/0416 222/57 |
| 4,502,024 A | * | 2/1985 | Nishikawa | H03K 7/08 332/109 |

(Continued)

FOREIGN PATENT DOCUMENTS

EP    1780411 A2    5/2007

OTHER PUBLICATIONS

Invitation to Pay Additional Fees from PCT/US2018/058460 dated Jan. 30, 2019 (17 pages).
(Continued)

*Primary Examiner* — Paul R Durand
*Assistant Examiner* — Michael J. Melaragno
(74) *Attorney, Agent, or Firm* — Calfee, Halter & Griswold LLP

(57) ABSTRACT

Exemplary soap, sanitizer and lotion dispensers are disclosed herein. An exemplary dispenser includes a housing; a receptacle for receiving a container; a container of fluid comprising soap, sanitizer or lotion; a pump in fluid communication with the container; a power source; a pump coupled to a motor and pulse width modulation circuitry in circuit communication with the power source and the motor. The pulse width modulation circuitry is initially set to cause a selected dose of fluid to be dispensed at a base speed. A sensor for detecting a parameter indicative of an actual speed of a dispense of the fluid is also included. When the actual speed of the dispense of fluid is less than the base speed or greater than the base speed, the pulse width modulation circuitry adjusts the pulse width to cause the speed of a following dispense of fluid to be closer to the base speed.

19 Claims, 8 Drawing Sheets

(52) U.S. Cl.
 CPC .............. *A47K 5/1211* (2013.01); *A47K 5/14* (2013.01); *H03K 7/08* (2013.01)

(58) Field of Classification Search
 USPC .................................................. 222/63, 325
 See application file for complete search history.

(56) References Cited

U.S. PATENT DOCUMENTS

| | | | | |
|---|---|---|---|---|
| 5,676,277 A * | 10/1997 | Ophardt | ............... | A47K 5/1205 222/83 |
| 5,836,482 A * | 11/1998 | Ophardt | ............... | A47K 5/1202 222/325 |
| 6,343,724 B1 * | 2/2002 | Ophardt | ............... | A47K 5/1202 137/543.23 |
| 6,957,751 B2 * | 10/2005 | Ophardt | ............... | A47K 5/1202 222/188 |
| 7,028,861 B2 * | 4/2006 | Sayers | ................. | A47K 5/1217 222/1 |
| 7,198,175 B2 * | 4/2007 | Ophardt | ............... | A47K 5/1202 222/188 |
| 7,303,099 B2 * | 12/2007 | Ophardt | ................... | A47K 5/14 222/321.8 |
| 7,611,030 B2 * | 11/2009 | Reynolds | ............. | A47K 5/1217 222/1 |
| RE43,288 E * | 4/2012 | Sund | ..................... | G01F 1/8413 137/209 |
| 8,240,508 B2 * | 8/2012 | Wegelin | ............... | B67D 1/0078 222/52 |
| 8,292,128 B2 * | 10/2012 | Hagleitner | ............... | A47K 5/16 222/190 |
| 8,783,510 B2 * | 7/2014 | Reynolds | ............. | A47K 5/1217 222/23 |
| 8,905,265 B2 * | 12/2014 | Muderlak | ............ | A47K 5/1207 222/38 |
| 8,960,498 B2 * | 2/2015 | Wegelin | ..................... | H02J 1/10 222/333 |
| 9,172,266 B2 * | 10/2015 | Curtis | .................. | A47K 5/1217 |
| 9,687,120 B2 * | 6/2017 | Muderlak | ............ | A47K 5/1207 |
| 10,079,502 B2 * | 9/2018 | Zosimadis | ............... | A47K 5/12 |
| 10,160,590 B2 * | 12/2018 | Wells | ..................... | B65D 83/16 |
| 10,164,477 B2 * | 12/2018 | Martin | ..................... | H02J 50/12 |
| 10,219,656 B2 * | 3/2019 | Pelfrey | ................. | A47K 5/1217 |
| 2003/0071058 A1 * | 4/2003 | Studer | ....................... | A47K 5/12 222/88 |
| 2003/0201286 A1 * | 10/2003 | Ophardt | ............... | A47K 5/1202 222/481.5 |
| 2004/0206772 A1 * | 10/2004 | Leifheit | ................. | A47K 3/281 222/83 |
| 2004/0217137 A1 * | 11/2004 | Ophardt | ............... | A47K 5/1202 222/481.5 |
| 2005/0061832 A1 * | 3/2005 | Ophardt | ............... | A47K 5/1202 222/188 |
| 2005/0161476 A1 * | 7/2005 | Ophardt | .............. | B05B 11/0044 222/481.5 |
| 2006/0243740 A1 * | 11/2006 | Reynolds | ............. | A47K 5/1208 222/52 |
| 2007/0194053 A1 * | 8/2007 | Ophardt | ............... | A47K 5/1202 222/189.01 |
| 2007/0199952 A1 * | 8/2007 | Carpenter | ................. | A61L 9/14 222/52 |
| 2008/0099515 A1 * | 5/2008 | Szuch | ..................... | B05B 12/00 222/504 |
| 2009/0308887 A1 * | 12/2009 | Woo | ...................... | A47K 5/1215 222/52 |
| 2012/0006848 A1 * | 1/2012 | Reynolds | ............. | A47K 5/1217 222/63 |
| 2012/0105155 A1 * | 5/2012 | Odagiri | ................... | H03F 3/217 330/207 A |
| 2012/0241470 A1 * | 9/2012 | Snodgrass | ............. | A61L 2/0088 222/63 |
| 2013/0292411 A1 * | 11/2013 | Bem | ...................... | A47K 5/1217 222/52 |
| 2014/0151394 A1 * | 6/2014 | Curtis | .................. | A47K 5/1217 222/1 |
| 2014/0203047 A1 * | 7/2014 | McNulty | ............... | B05B 7/0025 222/190 |
| 2014/0367419 A1 * | 12/2014 | Harris | ....................... | A47K 5/14 222/190 |
| 2015/0054553 A1 * | 2/2015 | Odagiri | ................... | H03F 3/217 327/134 |
| 2015/0114992 A1 * | 4/2015 | dos Santos | ............. | F16N 13/02 222/63 |
| 2015/0208877 A1 * | 7/2015 | Harris | .................. | A47K 5/1211 222/383.1 |
| 2015/0239644 A1 * | 8/2015 | Wells | ..................... | B65D 83/16 222/325 |
| 2015/0251841 A1 * | 9/2015 | McNulty | ............... | B05B 7/0025 222/325 |
| 2015/0268642 A1 * | 9/2015 | Nessel | ...................... | H02P 8/16 700/282 |
| 2015/0313423 A1 * | 11/2015 | McNulty | .................. | A47K 5/14 222/190 |
| 2016/0037976 A1 * | 2/2016 | Curtis | .................. | A47K 5/1217 222/173 |
| 2016/0309967 A1 * | 10/2016 | Pelfrey | ................. | A47K 5/1217 |
| 2017/0049276 A1 * | 2/2017 | Lightner | ............. | A47K 5/1202 |
| 2017/0190558 A1 * | 7/2017 | Ubidia | ................. | B67D 1/0892 |
| 2018/0354777 A1 * | 12/2018 | Slater | ................... | B67D 3/0074 |
| 2019/0081620 A1 * | 3/2019 | Bourdel | .................. | H03K 7/08 |
| 2019/0133383 A1 * | 5/2019 | McNulty | .............. | A47K 5/1207 |
| 2019/0133384 A1 * | 5/2019 | McNulty | .............. | A47K 5/1202 |
| 2019/0171244 A1 * | 6/2019 | Wegelin | ............... | H03K 17/941 |

OTHER PUBLICATIONS

International Search Report and Written Opinion from PCT/US2018/058460 dated Mar. 26, 2019 (20 pages).

\* cited by examiner

TOUCH-FREE DISPENSERS

RELATED APPLICATIONS

The present invention the benefits of and priority to U.S. Provisional Patent Application Ser. No. 62/581,830, titled TOUCH-FREE DISPENSERS, filed on Nov. 6, 2017 and which is incorporated herein by reference in its entirety.

TECHNICAL FIELD

The present invention relates generally to touch free soap, sanitizer or lotion dispenser systems and more particularly to power systems for touch free dispensers.

BACKGROUND OF THE INVENTION

In touch-free (or hands-free) dispensers, a liquid or foam pump is activated by a drive actuator through a drive cycle to dispense a dose of fluid. The drive actuator is powered by a direct current (DC) motor with a drive train formed of gears or other known mechanical components. The drive train (including the motor) strokes or spins the pump. The motor is typically powered by a battery. The power that is delivered to the motor is determined by the motor draw (or load on the motor) and the power capacity of the power source. Dispensers typically use a controller or microprocessor that receives a signal from a user sensor to dispense a dose of fluid and sends a signal to a switch device (such as, for example, a power transistor or relay). The switch device connects the power source to the motor for the duration of the actuation cycle. The motor draws power (or current) from the power source as it needs and the power source provides power at whatever level that it can provide. Typical dispensers do not control on the motor speed or limit power delivered from the power source.

SUMMARY

Exemplary soap, sanitizer and lotion dispensers are disclosed herein. An exemplary dispenser includes a housing; a receptacle for receiving a container; a container of fluid comprising soap, sanitizer or lotion; a pump in fluid communication with the container; a power source; a pump coupled to a motor and pulse width modulation circuitry in circuit communication with the power source and the motor. The pulse width modulation circuitry is initially set to cause a selected dose of fluid to be dispensed at a base speed. A sensor for detecting a parameter indicative of an actual speed of a dispense of the fluid is also included. When the actual speed of the dispense of fluid is less than the base speed or greater than the base speed, the pulse width modulation circuitry adjusts the pulse width of the voltage to cause the speed of a following dispense of fluid to be closer to the base speed.

Another exemplary dispenser includes a housing; a receptacle for receiving a container; a container of fluid comprising soap, sanitizer or lotion; a pump in fluid communication with the container; a power source; a motor coupled to the pump; memory for storing a stored speed of dispense; pulse width modulation circuitry in circuit communication with the power source and the motor; a sensor for sensing rotation of the pump or motor; and a processor for receiving a signal from the sensor and determining a speed of dispense for a dose of fluid. The processor causes the pulse width circuitry to adjust the width of the voltage pulse applied to the motor after a preselected number of dispenses to cause a following speed of dispense to be at about the stored speed of dispense.

Another exemplary dispenser includes a housing; a receptacle for receiving a container; a container of fluid comprising soap, sanitizer or lotion; a pump in fluid communication with the container; a power source; a motor coupled to the pump; a processor; and pulse width modulation circuitry in circuit communication with the power source and the motor. The pulse width modulation circuitry is initially set to cause a selected dose of fluid to be dispensed over a selected period of time. A sensor for detecting a parameter indicative of selected dose of fluid being dispensed is also included. The processor uses the parameter indicative of a selected dose of fluid being dispensed and the time of dispense to cause the pulse width modulation circuitry to adjust the width of the voltage pulse to cause a following dispense of fluid to be dispensed over the selected period of time.

Another exemplary dispenser includes a housing; a receptacle for receiving a container; a container of fluid comprising soap, sanitizer or lotion; a key secured to the container. The key contains data indicative of a parameter used to determine a dispense speed and dispense time. A reader for reading the data on the key; a processor; pulse width modulation circuitry; a motor; a pump coupled to the motor and a power source are included in the dispenser. The processor causes the pulse width modulation circuitry to deliver a voltage to the motor having a pulse width selected as a function of the data read from the key to dispense at the desired speed for a desired dispense time.

Another exemplary dispenser includes a housing; a receptacle for receiving a container; a container of fluid comprising soap, sanitizer or lotion; a communication port; a processor; memory; pulse width modulation circuitry; a motor; a pump coupled to the motor; and a power source. The communication port is configured to receive one or more signals for setting the speed of dispense and the time of dispense. The processor causes the pulse width modulation circuitry to deliver a voltage to the motor having a pulse width selected as a function of the one or more signals to dispense at the desired speed for a desired dispense time.

Another exemplary dispenser includes a housing; a receptacle for receiving a container; a reservoir located below the receptacle; the reservoir having an inlet; the reservoir having an outlet. The inlet and the outlet are offset from one another. A pump is included that has an inlet connected to the reservoir outlet. A motor is coupled to the pump and a power source are also included. The reservoir is filled from a refill unit that includes the container and the pump draws fluid out of the reservoir.

BRIEF DESCRIPTION OF THE DRAWINGS

These and other features and advantages of the present invention will become better understood with regard to the following description and accompanying drawings in which.

DETAILED DESCRIPTION

The following includes definitions of exemplary terms used throughout the disclosure. Both singular and plural forms of all terms fall within each meaning. Except where noted otherwise, capitalized and non-capitalized forms of all terms fall within each meaning:

"Circuit communication" as used herein indicates a communicative relationship between devices. Direct electrical, electromagnetic and optical connections and indirect electrical, electromagnetic and optical connections are examples of circuit communication. Two devices are in circuit communication if a signal from one is received by the other, regardless of whether the signal is modified by some other device. For example, two devices separated by one or more of the following—amplifiers, filters, transformers, optoisolators, digital or analog buffers, analog integrators, other electronic circuitry, fiber optic transceivers or satellites—are in circuit communication if a signal from one is communicated to the other, even though the signal is modified by the intermediate device(s). As another example, an electromagnetic sensor is in circuit communication with a signal if it receives electromagnetic radiation from the signal. As a final example, two devices not directly connected to each other, but both capable of interfacing with a third device, such as, for example, a CPU, are in circuit communication.

Also, as used herein, voltages and values representing digitized voltages are considered to be equivalent for the purposes of this application, and thus the term "voltage" as used herein refers to either a signal, or a value in a processor representing a signal, or a value in a processor determined from a value representing a signal.

"Signal", as used herein includes, but is not limited to one or more electrical signals, analog or digital signals, one or more computer instructions, a bit or bit stream, or the like.

"Logic," synonymous with "circuit" as used herein includes, but is not limited to hardware, firmware, software and/or combinations of each to perform a function(s) or an action(s). For example, based on a desired application or needs, logic may include a software controlled microprocessor or microcontroller, discrete logic, such as an application specific integrated circuit (ASIC) or other programmed logic device. Logic may also be fully embodied as software. The circuits identified and described herein may have many different configurations to perform the desired functions.

The values identified in the detailed description are exemplary and they are determined as needed for a particular dispenser and/or refill design. Accordingly, the inventive concepts disclosed and claimed herein are not limited to the particular values or ranges of values used to describe the embodiments disclosed herein.

Figure 1:
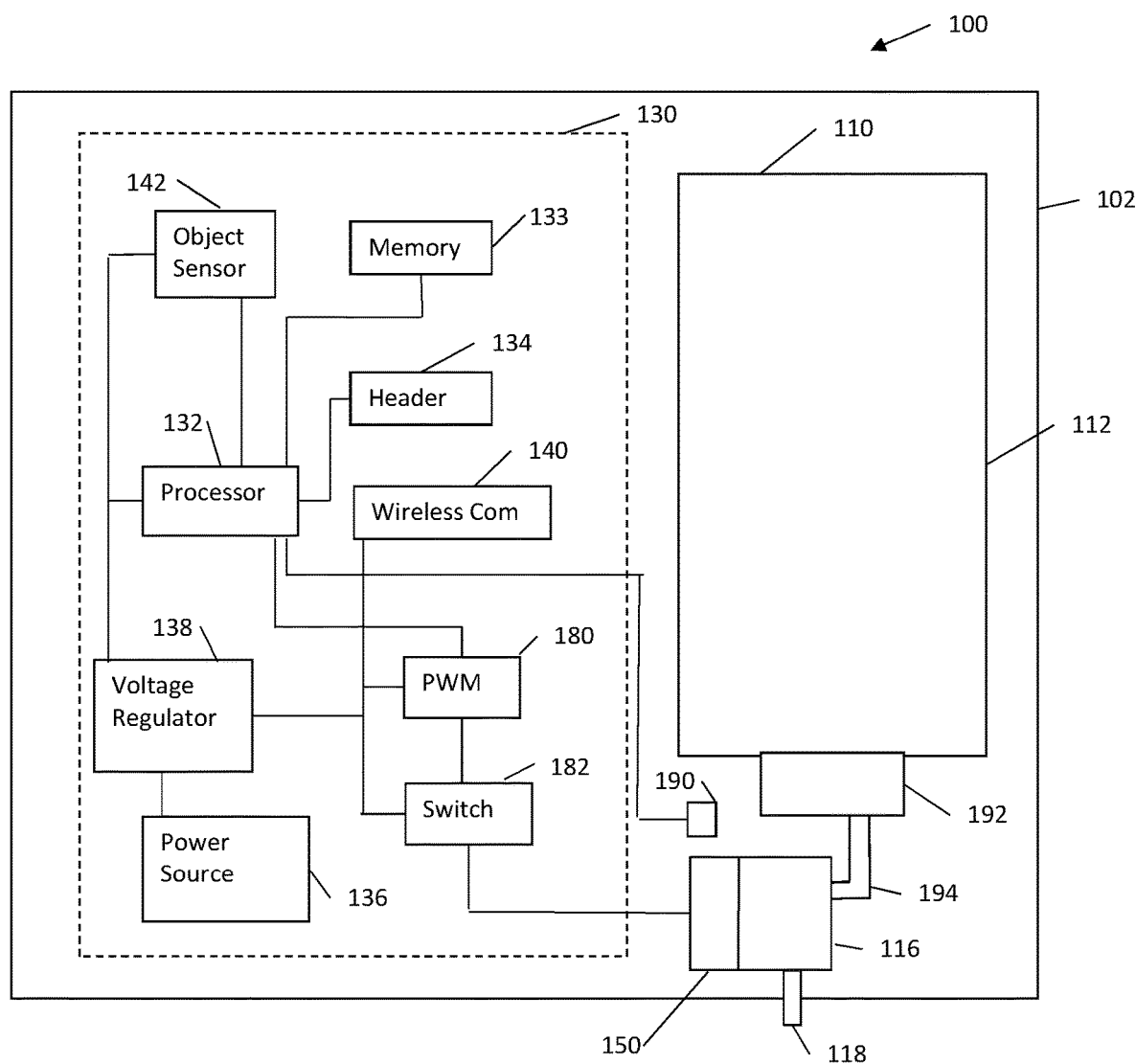
FIG. 1 is a illustrative schematic diagram of an exemplary dispenser system having a refill unit.

FIG. 1 illustrates an exemplary dispenser 100 with a refill unit 110 installed therein. Dispenser 100 includes a housing 102. In some embodiments, housing 102 encloses the refill unit 110. In some embodiments, refill unit 110 is partially located within hosing 102. In some embodiments, refill unit 110 connects to the top of housing 102. Located within housing 102 is system circuitry 130.

System circuitry 130 may be on a single circuit board or on multiple circuit boards. In addition, some of the circuitry 130 may be mounted separately, i.e. not located on a circuit board, and electrically connected to the other components as required. In this embodiment, system circuitry 130 includes a processor 132, memory 133, an optional header 134 that may be used for programming the dispenser, a power source 136, a voltage regulator 138, an object sensor 142, pulse width modulation circuitry 180, switching device 182, optional wireless communication circuitry 140, and a speed sensor 190. In various embodiments, not all of these components are required. In some embodiments, pulse width modulation circuitry 180 may be power control circuitry. Pulse width modulation varies the power delivered to the motor by varying the width of the pulse of voltage applied to the motor. Other power control circuitry may include, for example, circuitry for varying the voltage or varying the current. All of the embodiments described herein with respect to pulse width modulation circuitry should also be construed to disclosing power control circuitry for performing the functions described herein with respect to pulse width modulation circuitry (and may be referred to as a communication port).

Processor 132 may be any type of processor, such as, for example, a microprocessor or microcontroller, discrete logic, such as an application specific integrated circuit (ASIC), other programmed logic devices or the like. Processor 132 is in circuit communication with optional header 134. Header 134 is a circuit connection port that allows a user to connect to system circuitry 130 to program the circuitry, run diagnostics on the circuitry and/or retrieve information from the circuitry.

Processor 132 is in circuit communication with memory 133. Depending on the need, memory 133 may be any type of memory, such as, for example, Random Access Memory (RAM); Read Only Memory (ROM); programmable read-only memory (PROM), electrically programmable read-only memory (EPROM), electrically erasable programmable read-only memory (EEPROM), flash, magnetic disk or tape, optically readable mediums including CD-ROM and DVD-ROM, or the like, or combinations of different types of memory. In some embodiments, the memory 133 is separate from the processor 132, and in some embodiments, the memory 133 resides on or within processor 132.

A power source 136, such as, for example, one or more batteries, is also provided. The power source 136 is in circuit communication with optional voltage regulator circuitry 138. In some exemplary embodiments, voltage regulator circuitry 138 provides regulated power to processor 132, object sensor 142, wireless communication circuitry 140.

Optional wireless communication circuitry 140 may be any type of wireless transmitting and/or receiving circuitry, such as for example, wireless RF, BlueTooth®, ANT®, infrared, or the like, configured to allow wireless communication with the dispensers disclosed herein and/or wireless programming of the dispensers disclosed herein.

Processor 132 is also in circuit communication with an optional object sensor 142 for detecting whether an object is present in the dispense area. Object sensor 142 may be any type of passive or active object sensor, such as, for example, an infrared sensor and detector, a proximity sensor, an imaging sensor, a thermal sensor or the like.

In addition, processor 132 is in circuit communication with pulse width modulation circuitry 180. Pulse width modulation circuitry 180 is in circuit communication with switching device 182. In some embodiments, pulse width modulation circuitry 180 and switching device 182 are combined as one circuit. In some embodiments, pulse width modulation circuitry 180 may be replaced with voltage adjusting circuitry (not shown), or current adjusting circuitry (not shown) that may be used to adjust the voltage or current up or down to perform the functions claimed herein.

Switching device 182 is in circuit communication with power source 136 and motor 150. During operation, processor 132 provides signals to pulse width modulation circuitry 180, which cause pulse width circuitry 180 to control switching device 182 to modulate the power provided by power source 136 to drive motor 150. More detailed descriptions of the modulated are described below. In some alternate embodiments the switching device 182 adjust the voltage and in some other alternate embodiments, switching device adjusts the current.

Processor 132 is in circuit communication with speed sensor 190 which measures speed of an element that correlates to producing an output of dispenser 100. In some embodiments, speed sensor 190 determines the rotational speed of motor 150 and/or pump 116. Accordingly, speed sensor 190 may be an any type of sensor that provides a feedback signal indicative of rotation or the motor 150 and/or pump 116. In some embodiments, speed sensor 190 senses revolutions of the motor 150 and/or pump 116 over a period of time, in some embodiments, speed sensor 190 senses rotational speed. The exemplary embodiments described herein have rotary pumps, however, in some embodiments, the pump is a piston pump. In the event of a piston pump, speed sensor 190 may sense linear motion of an output piston. In some embodiments, speed sensor 190 senses movement of the piston from point A to point B. In some embodiments, speed sensor 190 is an optical sensor. In some embodiments, speed sensor 190 senses an electric field. In some embodiments, speed sensor senses a magnetic field. In some embodiments, speed sensor 190 senses a capacitance. In some embodiments, speed sensor 190 senses an inductance. In some embodiments, speed sensor 190 senses pressure to provide a signal indicative of speed. In some embodiments, speed sensor 190 determines a speed based on one or more current wave forms. In some embodiments, speed sensor 190 may be used to determine the number of rotations of a pump or motor. In some embodiments, speed sensor 190 may be a magnetic reed.

In this exemplary embodiment, refill unit 110 is shown inserted in the dispenser 100 of FIG. 1. Refill unit 110 is inserted into dispenser 100 and removed from dispenser 100 as a unit. Refill unit 110 includes a container 112, a closure 192, an outlet valve (not shown) and in some embodiments, an air inlet valve (not shown) or vent valve. In some embodiments, refill unit 110 also includes a foamable liquid, such as, for example, a foamable soap, sanitizer, lotion, moisturizer or other liquid used for personal hygiene. In some embodiments, refill unit 110 is for use in a liquid dispenser, rather than a foam dispenser, and filled with liquid that is not foamed.

When the processor 132, through object sensor 142, determines that an object is within the dispense zone, the processor 132, through pulse width modulation circuitry 180 and switching device 182, causes the motor 150 to operate. Fluid is drawn from container 112 through liquid inlet 194 and into pump 116, which is driven by motor 150. In this exemplary embodiment, pump 116 is a sequentially operated multi-diaphragm pump that includes one liquid pump chamber and 3 air pump chambers. Some exemplary embodiments contain: more than one liquid pump chamber/diaphragm: more than 3 air pump chambers/diaphragms: or less than 3 air pump chambers/diaphragms. In some exemplary embodiments, a piston pump is used to pump the fluid.

Exemplary embodiments of sequentially operated multi-diaphragm pumps are shown and disclosed in: U.S. Non-Provisional application Ser. No. 15/429,389 filed on Feb. 10, 2017 and titled HIGH QUALITY NON-AEROSOL HAND SANITIZING FOAM; U.S. Non-Provisional application Ser. No. 15/369,007 filed on Dec. 5, 2016 and titled SEQUENTIALLY ACTIVATED MULTI-DIAPHRAGM FOAM PUMPS, REFILL UNITS AND DISPENSER SYSTEMS; U.S. Non-Provisional patent application Ser. No. 15/355,112 filed on Nov. 18, 2016 and titled SEQUENTIALLY ACTIVATED MULTI-DIAPHRAGM FOAM PUMPS, REFILL UNITS AND DISPENSER SYSTEMS; U.S. Non-Provisional application Ser. No. 15/350,190 filed on Nov. 14, 2016 and titled IMPROVED FOAMING CARTRIDGE; U.S. Non-Provisional application Ser. No. 15/356,795 filed on Nov. 21, 2016 and titled FOAM DISPENSING SYSTEMS, PUMPS AND REFILL UNITS HAVING HIGH AIR TO LIQUID RATIOS; and U.S. Non-Provisional application Ser. No. 15/480,711 filed on Apr. 6, 2017 and titled FOAM DISPENSING SYSTEMS, PUMPS AND REFILL UNITS HAVING HIGH AIR TO LIQUID RATIOS; each of which are incorporated herein in their entirety.

Additional exemplary dispensers as well as more detail on circuitry for the touch free dispensers may be more fully described and shown in U.S. patent application Ser. No. 13/770,360 titled Power Systems for Touch Free Dispensers and Refill Units Containing a Power source, filed on Feb. 19, 2013 which is also incorporated herein by reference in its entirety.

The rotation of motor 150 and pump 116 are detected by speed sensor 190. In this particular embodiment, speed sensor 190 determines revolutions of the motor 150, on or more gears (not shown) and/or pump 116. In this exemplary embodiment, one "dose" of fluid is produced by a selected number of revolutions of the motor 150 and/or pump 116. In this exemplary embodiment, the dispenser 100 is set to dispense a selected dose of fluid over a selected time period. For example, the dispenser may be set to dispense a dose of fluid, e.g. 1.5 mL, in a selected time period, for example, 1.5 seconds. Pulse width modulation circuitry 180 is set to control switching device 182 to provide a voltage having selected pulse widths to motor 150. The original selected pulse width may be, for example, a 50% duty cycle pulse width. The original pulse widths may be selected based on original specifications, such as, for example, a fully charged power source, a new motor, a full fluid container and the like.

Each time, or periodically, the dispenser 100 dispenses a selected dose of fluid, the dispense time it takes for the motor 150 and/or pump 116 to rotate the selected number of rotations to dispense the selected dose volume of fluid, is determined by the processor 132 and the dispense time and/or speed are stored in memory 133. The dispense time and/or speed may be used to adjust the pulse-width of future dispenses. For example, if the pulse width is originally set at a 50% duty cycle to dispense the selected dose volume of fluid, for example, 1.5 ml in a selected time, for example, 1.5 seconds, and processor 132 determines that it took 1.6 seconds to dispense the selected dose volume of fluid, the width of the pulses may be increased, to for example, 55%, to increase the speed of the motor which decreases the time to dispense the selected dose of fluid.

In some embodiments, the recalibration or resetting of the pulse-width occurs after each dispense event, however, preferable, the recalibration occurs periodically. In some embodiments, the recalibration occurs after a selected number of dispenses, such as, for example, every 20 dispenses, 30 dispenses, 40 dispense, 50 dispenses, or any desired number of dispenses. In some embodiments, the recalibration occurs after a selected time period, such as, for example, after 1 day, after 5 days, after 10 days, after 20 days, after 30 days, or the like. In some embodiments, the recalibration occurs after a combination of the number of dispenses and a period of time. In some embodiments, the recalibration occurs randomly.

In some embodiments, the recalculation occurs as a function of a parameter, such as, for example, the voltage. In some embodiments, the parameter is a voltage, and if the voltage changes by a predetermined amount, such as, for example, the voltage of the power source changes by a selected threshold, e.g. drops a set amount or set percentage, the recalculation occurs. In some embodiments, the parameter is a current draw. For example, if the current draw of the motor increases by a set amount or set percentage, the recalculation occurs. In some embodiments, the recalculation does not occur unless the parameter is outside the threshold on multiple dispenses in a row. Accordingly, the dispenser 100 can self-adjust or auto-adjust to changes in the dispenser components, such as, for example, motor wear, efficiency, pump stiffness and wear, environmental factors and the like to allow the selected dose of fluid to be consistently dispensed within a selected parameter, such as, for example, within a set dispense time.

Figure 2:
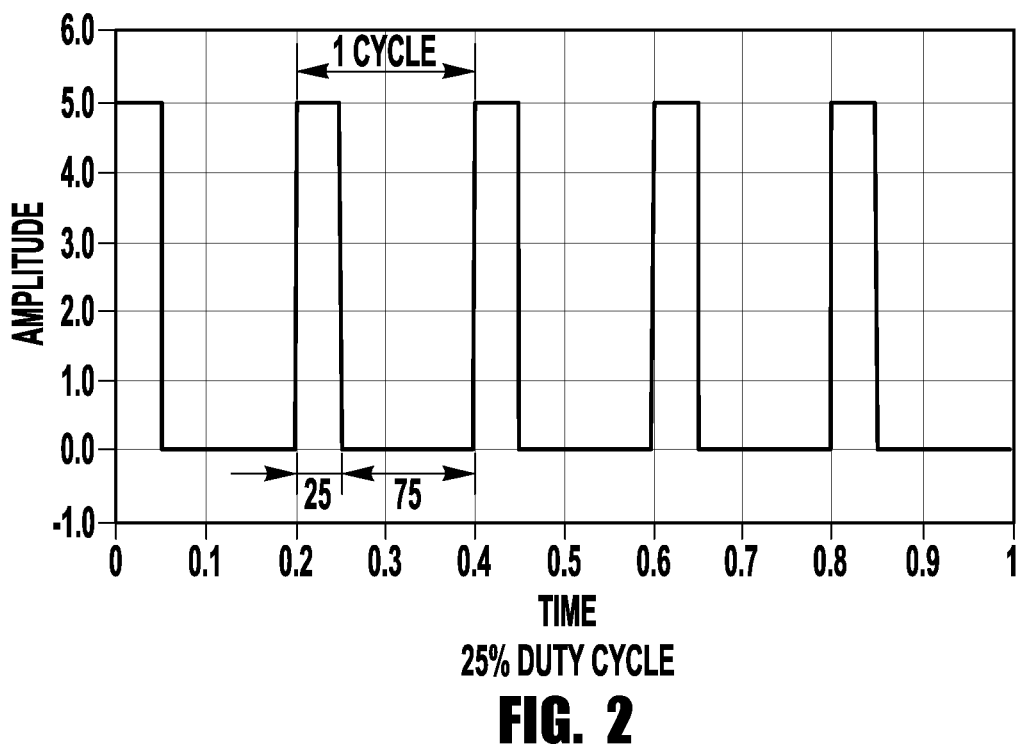
FIGS. 2 and 3 are exemplary illustrations of pulse width modulated duty cycles.
Figure 3:
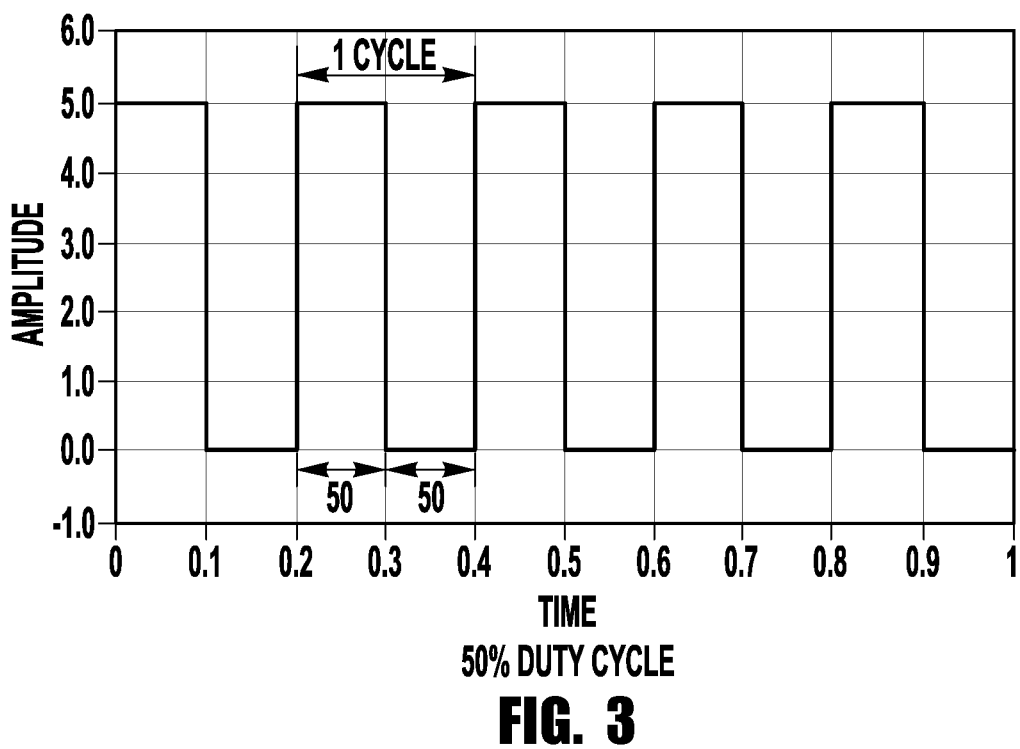

FIGS. 2 and 3 illustrates exemplary waveform outputs by pulse width modulation circuitry 180 and switching device 182. In these exemplary embodiments, the voltage is 5 volts and one cycle is 0.2 seconds. The wave form of FIG. 2 represents a 25% duty cycle, which means that the motor receives voltage pulses that are approximately 0.05 seconds long at about 5 volts followed by 0.15 seconds of substantially no voltage. Similarly, FIG. 3 illustrates a waveform that represents a 50% duty cycle, which means that the motor receives voltage pulses that are approximately 0.1 seconds long at about 5 volts followed by 0.1 seconds of substantially no voltage. Any suitable duty cycle may be used in the present application. Typically, the duty cycle is greater than a 10% duty cycle. As used herein, duty cycle applies to the percentage of a unit that voltage is applied for. For example, a 100% duty cycle means that the voltage is constantly applied. A 90% duty cycle means that the voltage is turned on for 90% of the cycle and off for 10% of the cycle. A 40% duty cycle means that the voltage is turned on for 40% of the cycle and off for 60% of the cycle.

In addition, in some embodiments, a change in voltage maybe used to achieve the same results. In some embodiments, the pulse width modulation circuitry may include voltage increasing/decreasing circuitry.

In addition, dispenser 100 is a tunable dispenser. In other words, dispenser 100 may be tailored to desired customer output or formula variations. For example, in some embodiments, the customer desires a smaller dose of fluid; in some embodiments, the customer desires a dryer foam output; in some embodiments, the customer desires a wetter foam output. Dispenser 100 is configured to accommodate these examples, and more.

The speed of motor 150 and pump 116 may be adjusted to adjust the foam quality. In this exemplary embodiment, pump 116 is a sequentially activated multi-diaphragm foam pump. Pump 116 has three air pump diagrams and a single liquid pump diaphragm, which is shown and described in one or more of the incorporated references. Because of the interactions between the pump diaphragms, the liquid/air ratio in the foam output is not consistent as the speed of pump 116 changes. For example, if pump 116 is run at a speed that dispenses foam that contains 1.1 mL of liquid in 0.9 seconds, the foam is a wetter foam. If pump 116 is run at a speed that dispenses foam that contains 1.1 mL of liquid in 0.7 seconds, the foam is a medium wetness. If pump 116 is run at a speed that dispensed foam that contains 1.1 mL of liquid in 0.5 seconds, the foam is a dry foam. Accordingly, the foam characteristics of the sequentially activated multi-diaphragm foam pump may be altered based on the speed of pump 116. In some embodiments, a user can connect a portable programming device to header 134 and change the desired speed of motor 150 and pump 116 to tailor the foam characteristics. In some embodiments, wireless communication circuitry 140 may be used to set the motor speed to alter the foam characteristics. In addition, the volume of fluid per dispense dose may be altered by running the pump longer. In some embodiments, pulse width modulation circuitry may be used to control the speed. Pulse width modulation varies the power delivered to the motor by varying the width of the pulse. Other power control circuitry includes circuitry for varying the voltage or varying the current may be used to control the speed. All of the embodiments described herein with respect to pulse width modulation circuitry should also be construed to disclosing power control circuitry for performing the functions described herein with respect to pulse width modulation circuitry.

Figure 4:
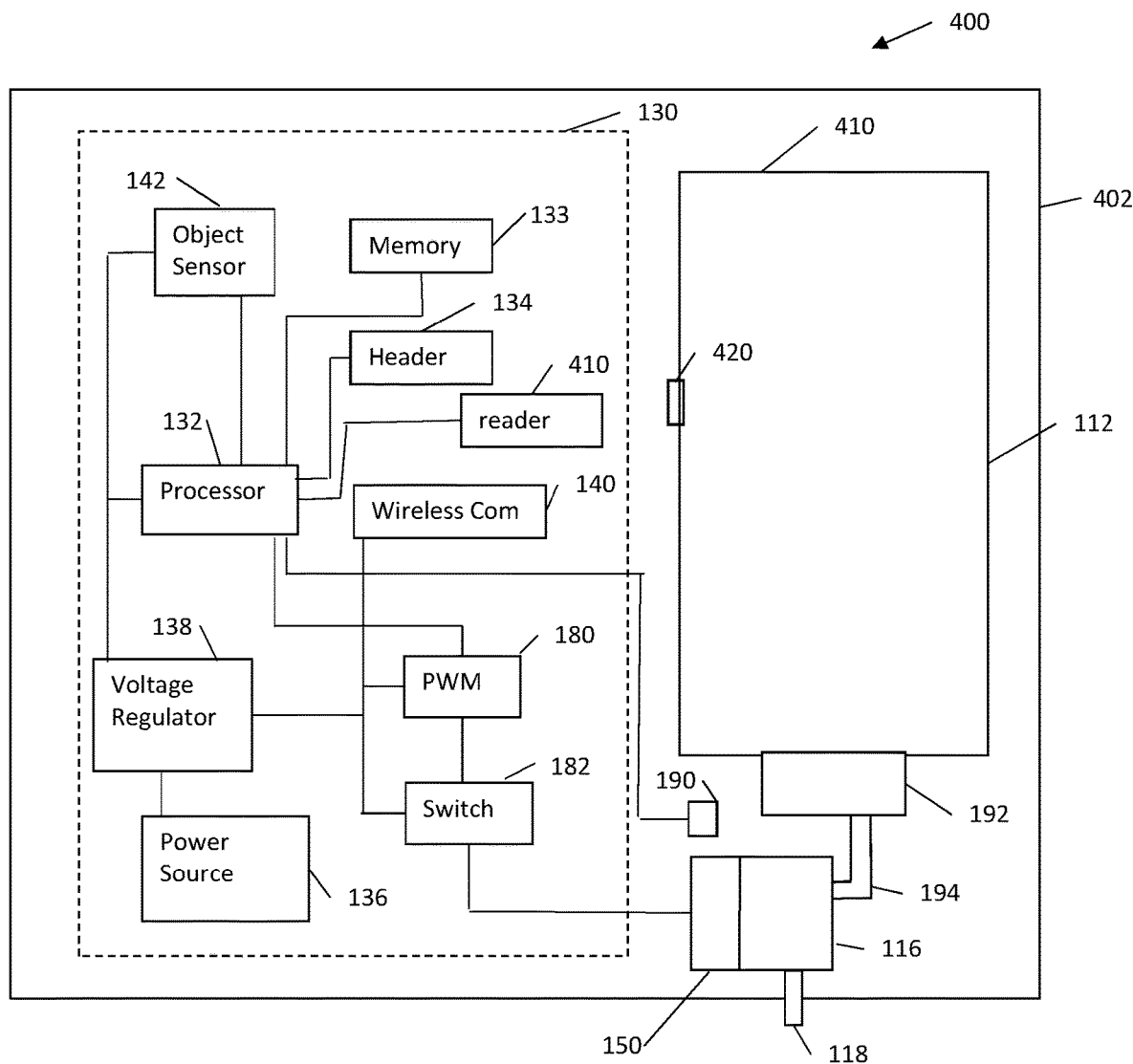
FIG. 4 is a illustrative schematic diagram of an exemplary dispenser system having a refill unit.

FIG. 4 illustrates another exemplary dispenser 400. Dispenser 400 is similar to dispenser 100 and like components have the same numerical identifiers and are not re-described herein. Dispenser 400 is an autocalibrating dispenser. In this exemplary embodiment, refill unit 112 includes a key 420. Preferably key 420 is an electronic key that can be read by reader 410, such as, for example, an RFID device. In some embodiments, key 410 is a color key that can be read by reader 410. In some embodiments, key 420 is a mechanical key that includes physical indicia indicative of the refill characteristics. Thus, key 420 is read either wirelessly, or through one or more sensors of the physical indicia through reader 410.

As a function of the data read from key 420, processor 132 determines the operating parameters for dispensing fluid from refill 410. For example, refill unit 410 may contain soap, concentrated soap, lotion, sanitizer or another type of fluid. Each of these different types of fluid may have different dispensing parameters or requirements. For example, if the refill unit 410 contains concentrated soap that requires a higher volume of air, dispenser 400 may operate motor 150 at a higher rate to increase air to liquid ratio of the fluid output and operate the dispenser 400 for a shorter period of time to dispense a lower volume of liquid. If the refill unit 410 includes non-concentrated soap, the dispenser may operate at a slower rate of speed for a longer time. Still yet, if the refill unit 410 contains a sanitizer, the dispenser may operate at yet another speed for yet another length of time. Accordingly, the dispenser 400 has the ability to auto calibrate its operating characteristics, such as, for example, speed, time, volume and the like as a function of data read from key 420. In addition, in some embodiments, the dispenser may alter the air to liquid ratio of foam outputs without changing the volume of the air or liquid pump chambers and without physically changing the compression expansion stroke of the liquid pump chamber or air pump chamber.

Figure 5:
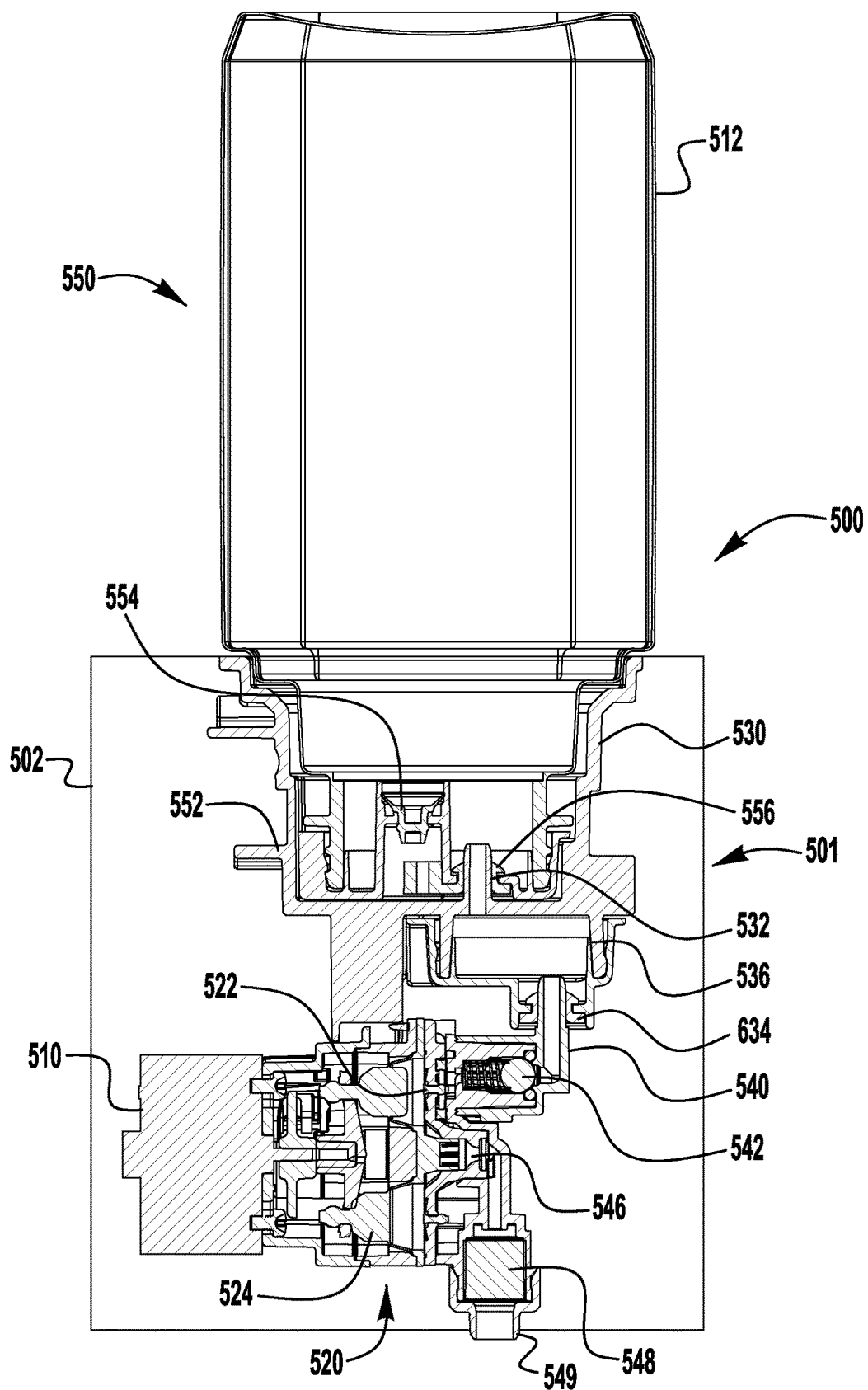
FIG. 5 is an exemplary touch free dispenser system with a refill unit.
Figure 6:
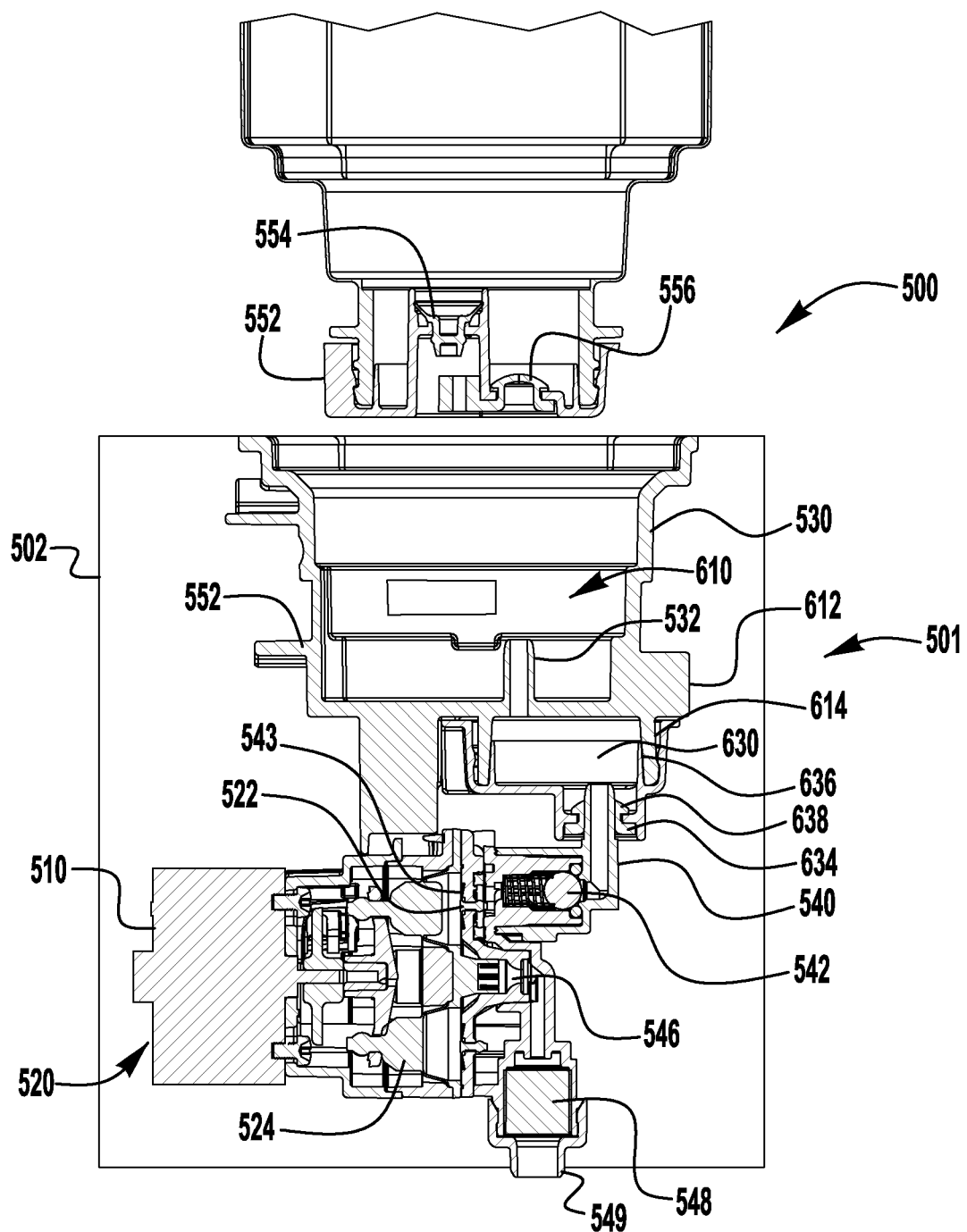
FIG. 6 is the exemplary touch free dispenser and refill unit of FIG. 5 with the refill unit being removed from the dispenser.

FIGS. 5 and 6 illustrate an exemplary embodiment of a dispenser system 500 having dispenser 501 and refill unit 550. In FIG. 5, refill unit 550 is inserted in dispenser 501. In FIG. 6, refill unit 550 is located above dispenser 501. Refill unit 550 includes a container 512 having a closure 552. Container 512 is a semi-rigid container that is designed to maintain its shape as liquid is drawn out of the container 512 and may be referred to herein as a non-collapsible container. To prevent collapsing the container or building up an unacceptable vacuum pressure, located within closure 552 is a vent valve 554 for allowing air to flow into the container as liquid flows out to allow container 512 to maintain its shape and allow liquid to flow out of container 512. Vent valve 554 is selected to have a low enough cracking pressure to prevent creating a vacuum pressure that would cause container 512 to deform or collapse.

Also located within closure 552 is an outlet valve 556. Outlet valve 556 is configured to prevent fluid form flowing out of the container 512 when container 512 is not inserted into dispenser 501. In some embodiments, outlet valve 556 is a puncture valve. In other words, outlet valve 556 is solid without an opening until it is inserted into dispenser 501 and the outlet valve 556 is punctured by liquid inlet conduit 532 when refill unit 550 is inserted into dispenser 501. In some embodiments, outlet valve 556 is a slit valve, or has a small opening that is normally closed and opens when pushed over liquid inlet conduit 532. In some embodiments, the outlet valve 556 may be elastomeric. In some embodiments, the outlet valve 556 may made of rubber, silicon or the like. In some embodiments, outlet valve 532 includes a movable portion (not shown) and a seat (not shown) and when refill unit 550 is inserted into dispenser 501 the movable portion moves off of the seat to allow fluid to flow out of container 512 into liquid inlet 532. An exemplary refill unit is shown and described in U.S. provisional patent application 62/420, 927, titled DISPENSERS, REFILL UNITS, AND REUSABLE/REPLACEABLE PUMP ASSEMBLIES and filed on Nov. 11, 2016, and was filed as a PCT application No. PCT/US17/61013 on Nov. 10, 2017 and which is incorporated herein by reference in its entirety.

Dispenser 501 has a housing 502 and receptacle 610. Refill unit 550 fits into receptacle 610. Receptacle 610 includes a catch mechanism (not shown) that engages refill unit 550 and prevents refill unit 550 from being removed from receptacle 610. A release mechanism (not shown) is used to remove refill unit 550 from dispenser 501. Located at the bottom of receptacle 610 is liquid inlet conduit 556. Liquid inlet conduit 536 is in fluid communications with reservoir 630.

Reservoir 630 may be formed in part by hosing 612. Housing 612 includes annular projection 614. Reservoir 630 includes reservoir housing 632 which connects to housing 612. Located at one end of reservoir hosing 632 is a liquid outlet 634 that includes an optional seal 638. Seal 638 seals around pump inlet conduit 540. Other methods may be used to connect conduit to reservoir housing 632 such as, for example, a welled connection. Reservoir liquid inlet conduit 556 is off-set from reservoir liquid outlet conduit 634.

Reservoir 630 provides a reserve of fluid when refill unit 550 is replaced. In some embodiments, the reserve of fluid helps prevent a loss of prime when refill unit 550 is replaced. In addition, in some embodiments, reservoir 630 allows flexibility for locating pump 520 and motor 510 within housing 502. In some embodiments, the pump inlet conduit 540 may be located at multiple positions, simply by rotating reservoir housing 632. In addition, liquid outlet 634 may be moved to different locations on reservoir housing 34.

Pump 520, which may be any pump, such as, for example, those incorporated herein above, includes a liquid pump chamber 522 and a plurality of air pump diaphragms 524 (only one shown). Pump 520 includes a first liquid inlet valve 542, a second liquid inlet valve 542, a mixing chamber 546, foaming member 548 and outlet 549. Dispenser 500 may be operated as described in the other embodiments described or incorporated herein. In some embodiments, first liquid inlet valve 542 has a first cracking pressure and second inlet valve 542 has a second cracking pressure. In some embodiments, the first cracking pressure is higher than the second cracking pressure. Exemplary embodiments having two liquid inlet valves are shown and described in U.S. Provisional Application Ser. No. 62/581,820 titled Double Inlet Valve for Enhanced Pump Efficiency filed on Nov. 6, 2017, which is incorporated herein by reference in its entirety.

Figure 7:
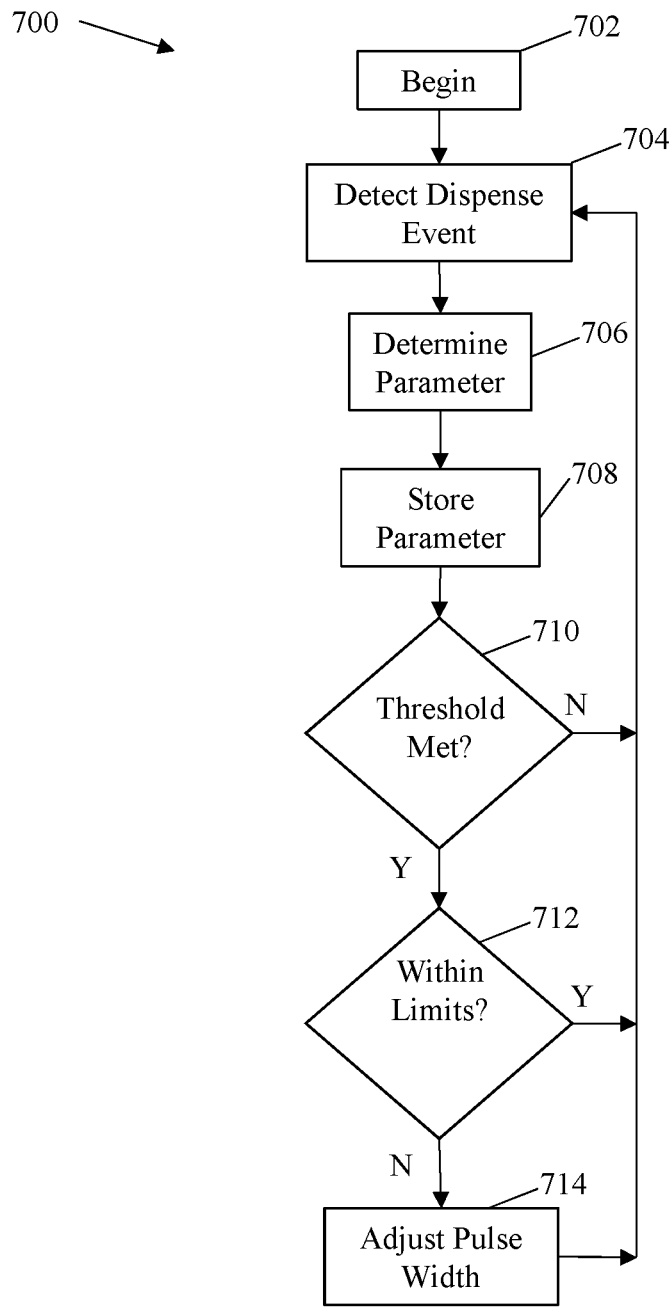
FIGS. 7 through 9 are exemplary methodologies for calibrating a dispenser.

The methodologies disclosed herein may include additional steps or fewer steps. In addition, the order of the sequence of the blocks is not limiting and the sequence may be performed in different or various orders. FIG. 7 is an exemplary methodology 700 for controlling a dispenser to ensure a consistent output throughout the life of the refill unit. The exemplary methodology 700 begins at block 702. At block 704 a dispense event is detected. During a dispense event, the dispenser dispenses a set volume of fluid. In some embodiments, the dispenser is originally calibrated to dispense a set volume of fluid in a set time. For example, the dispenser may be set to dispense 1.1 mL of fluid in 0.7 seconds. To achieve the desired speed/time of dispense, the pulse width modulation circuitry is initially set at a base or setpoint, such as, for example, a 25% duty cycle. In other words, if a cycle is 0.2 seconds, the pulse with modulation circuitry, set a 25%, would deliver a 0.05 second pulse of voltage to the motor out of 0.2 second cycle or time frame for the selected period of time to dispense the selected dose of fluid.

Each time a dispense event occurs, a dispense parameter, such as, for example, the time and/or speed of the dispense event is determined at block 706. As described above, other parameters indicative of the dispense time and/or dose size may be measured include, for example, dispenser voltage, current draw and the like. In addition, as described above, in some embodiments, the dispense parameter is determined after a selected number of dispenses or after some other criteria is met.

The parameter, such as, for example, time and/or speed, for the dispense is stored at block 708. At block 710 the parameter is compared to a threshold. If the desired parameter is number of dispenses, the methodology determines if the number of dispenses has passed a threshold number of dispenses. If the threshold is time, the methodology determines if a set period of time has passed. The parameter is updated and if the threshold has not been reached, the methodology loops to block 704. If the threshold has been met, a determination of whether the parameter is within its acceptable limits, or within a set threshold. For example, if the parameter is speed, a determination is made as to whether the speed is within the acceptable limits or threshold. If it is, the methodology loops back to block 704. If it is not, the width of the voltage pulse powering the motor is adjusted. In some embodiments, one or more of the above blocks are not used. In some embodiments additional blocks are used.

In some embodiments, the dispenser is recalibrated after every dispense and block 710 is not required. In some embodiments, the dispenser is recalibrated after 2 or more dispenses; in some embodiments, the dispenser is recalibrated after 5 dispenses; in some embodiments, the dispenser is recalibrated after 10 dispenses; in some embodiments, the dispenser is recalibrated after 15 dispenses; in some embodiments, the dispenser is recalibrated after 20 dispenses; in some embodiments, the dispenser is recalibrated after 25 dispenses; in some embodiments, the dispenser is recalibrated after 30 dispenses; in some embodiments, the dispenser is recalibrated after 35 dispenses; in some embodiments, the dispenser is recalibrated after 40 dispenses; in some embodiments, the dispenser is recalibrated after 45 dispenses or more.

In some embodiments, the parameter is time and in some embodiments, the recalibration occurs after a selected time period, such as, for example, after 1 day, after 5 days, after 10 days, after 20 days, after 30 days, or the like. In some embodiments, the recalibration occurs as a function of a combination of the number of dispenses and one or more periods of time. For example, the dispenser may typically recalibrate itself after 25 dispenses, however, if a set time period, such as for example 5 days has passed since the last recalibration, it may only require 10 dispenses to trigger a recalibration. In some embodiments, the dispenser may recalibrate after a selected number of dispenses or a selected time period, whichever comes first.

Figure 8:
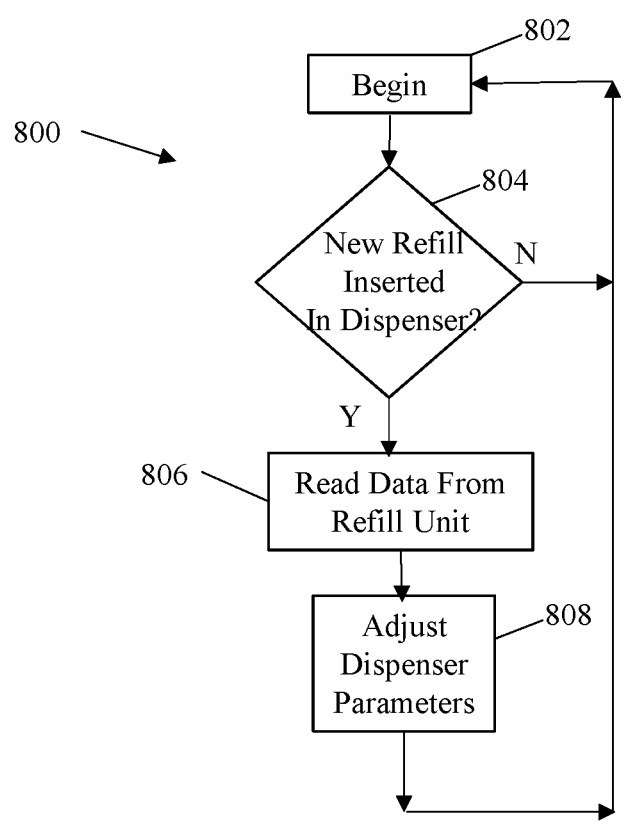

FIG. 8 is an exemplary methodology 800 for auto-calibrating a dispenser. In some embodiments, the dispenser is able to dispense many different types of products, such as, for example, soap, concentrated soap, sanitizer, foam sanitizer, lotion and the like. However, one or more dispensing parameters, such as, for example, amount of fluid, speed of dispense, length of dispense and the like are different for the different types of fluid. In some embodiments, a fluid having one formulation, may be dispensed with different parameters based on customer preferences, such as, for example, the desire for a wetter foam or a dryer foam, or for a smaller or larger dose of fluid.

The exemplary methodology 800 begins at block 802 and at block 804 a determination is made as to whether a new refill unit has been installed in the dispenser. If no new refill has been inserted in the dispenser, the methodology loops back to block 802. If a new refill unit has been installed in the dispenser, data is read from the refill unit at block 806. At block 808, the dispenser automatically calibrates the dispenser for the type of fluid in the refill unit. In some embodiments, the methodology ends after block 808. In such and embodiment, the dispenser can only be calibrated for one type of fluid. This prevents a worker from accidently inserting the wrong type of fluid in a dispenser. For example, if the dispenser is used in a hospital and requires hand sanitizer, lotion cannot be dispensed from the dispenser after it is initially set up as a sanitizer dispenser. In some embodiments, the methodology does not end at block 808 but rather loops back and if a new refill unit is installed and the data read from the refill unit is different than the original refill unit, the parameters adjusted at block 808 disables the dispenser. In some embodiments, if data read from the refill unit is different than the original refill unit, the dispenser is recalibrated for the new refill unit.

Figure 9:
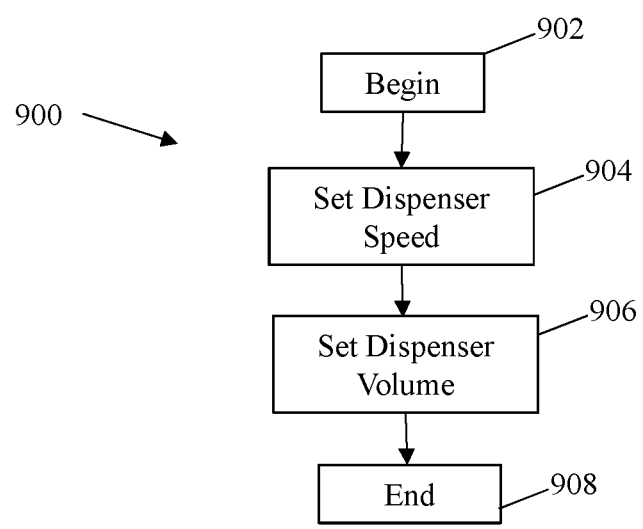

FIG. 9 is an exemplary methodology 900 for adjusting the output of a dispenser. In some embodiments, the dispenser is adjusted to adjust the fluid output. The exemplary methodology begins at block 902. At block 904 ad dispenser parameter, such as, for example, the dispenser speed may be adjusted. The speed may be adjusted to, for example, adjust the wetness or dryness of a foam output. A faster speed gives a wetter foam output and a slower speed produces a dryer foam. The methodology movers to block 906 and, if desired, the volume of output is adjusted. Other parameters, such as, for example, time between dispenses, excessive use parameters and the like may be set. In some embodiments, limiting the ability for a user to obtain many doses of fluid over a short period of time may be desirable to prevent waste. In some embodiments, excessive use parameters may be set, to for example, prevent someone from obtaining more fluid from the dispenser over a set time.

The parameters may be adjusted by connecting to the header, or communication port, of the dispenser with a portable device, such as, for example, a laptop or PDA. In some embodiments, the dispenser parameters are configured wirelessly, through for example, one or more networks, through the internet, or in close proximity, by for example, a blue tooth connection to a PDA, such as, for example, a smart phone.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. It is not the intention of the applicant to restrict or in any way limit the scope of the appended claims to such detail. Unless expressly excluded herein, all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure; however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention. Descriptions of exemplary methods or processes are not limited to inclusion of all steps as being required in all cases, nor is the order in which the steps are presented to be construed as required or necessary unless expressly so stated.

We claim:

1. A soap, sanitizer or lotion dispenser comprising:
a housing;
a receptacle for receiving a container;
a container of fluid comprising soap, sanitizer or lotion;
a pump in fluid communication with the container;
a processor;
memory;
a power source;
a motor;
the pump coupled to the motor;
pulse width modulation circuitry in circuit communication with the power source and the motor;
wherein the pulse width modulation circuitry is initially set to a first signal having a first value defining a first pulse width to cause a selected dose of fluid to be dispensed at a selected base speed;

wherein the first value is constant during the dispensing of a first dose of fluid;

a sensor for detecting a first dispense parameter indicative of an actual speed of the first dispense of the dose of fluid;

storing the first dispense parameter in the memory;

comparing the stored first dispense parameter to the selected base speed to determine whether the actual speed during the first dispense of fluid is less than or greater than the selected base speed;

wherein if the actual speed during the first dispense of fluid is less than the selected base speed or greater than the selected base speed, the pulse width modulation circuitry adjusts the first value defining the first pulse width to a second signal having a second value defining a second pulse width that is different than the first value to cause the speed of a subsequent dispense of fluid to be closer to the selected base speed;

wherein the first dispense of fluid is separate and discrete from the subsequent dispense of fluid.

2. The soap, sanitizing or lotion dispenser of claim 1 wherein the sensor for detecting a parameter detects rotation of the pump or motor.

3. The soap, sanitizing or lotion dispenser of claim 1 wherein the sensor for detecting a parameter is an optical sensor.

4. The soap, sanitizing or lotion dispenser of claim 1 wherein the pulse width modulation circuitry adjusts the pulse width to cause the speed of the subsequent dispense of fluid to be closer to the base speed when the actual speed of the first dispense of fluid is outside a threshold value of the base speed.

5. The soap, sanitizing or lotion dispenser of claim 4 wherein the threshold is plus or minus about 5% of the base speed.

6. The soap, sanitizing or lotion dispenser of claim 1 wherein the pulse width modulation circuitry adjusts the pulse width after a preselected number of dispenses of fluid, and wherein the preselected number of dispenses of fluid is greater than 1.

7. The soap, sanitizing or lotion dispenser of claim 1 wherein the pulse width modulation circuitry adjusts the pulse width after a preselected time period has elapsed, wherein the preselected time period occurs after an immediate subsequent dispense.

8. The soap, sanitizing or lotion dispenser of claim 1 wherein the pulse width modulation circuitry adjusts the pulse width as a function of a preselected number of dispenses of fluid and an elapsed time period greater than the time required to dispense an immediate subsequent dose of fluid.

9. A soap, sanitizer or lotion dispenser comprising:
a housing;
a receptacle for receiving a container;
a container of fluid comprising soap, sanitizer or lotion;
a key secured to the container;
the key containing data that includes a dispense speed for a motor and a dispense time for a dose of fluid to be dispensed;
a reader for reading the data on the key;
a processor;
pulse width modulation circuitry;
a motor;
a pump coupled to the motor;
a power source;
wherein the processor causes the pulse width modulation circuitry to deliver a voltage to the motor having a first pulse width selected as a function of the data read from the key to dispense at the desired speed for a desired dispense time;
wherein a signal driving the first pulse width is not varied over the desired dispense time;
a sensor;
wherein the processor determines the actual speed and dispense time of a first dispense event;
wherein the actual speed and/or dispense time of the first dispense event is stored in the memory;
wherein the processor compares the actual speed or dispense time of the first dispense event to the desired speed or the desired dispense time;
wherein the processor causes the pulse width modulation circuitry to deliver a voltage to the motor having a second pulse width that is different than the first pulse width upon a subsequent dispense,
wherein the signal driving the subsequent pulse width is not varied over the subsequent dispense time, and
wherein the subsequent dispense occurs after a selected period of time or a selected number of dispenses; and
wherein the selected number of dispenses is greater than 1 dispense and the selected period of time is greater than one day.

10. The soap, sanitizer or lotion dispenser of claim 9 wherein the pulse width modulation circuitry adjusts the width of the voltage pulses applied to the motor in a subsequent dispense to cause the dispense speed to be closer to the dispense speed that is a function of the parameter stored on the key.

11. The soap, sanitizer or lotion dispenser of claim 10 wherein the sensor detects rotation of the pump or motor.

12. The soap, sanitizing or lotion dispenser of claim 10 wherein the pulse width modulation circuitry adjusts the pulse width of a subsequent dispense cycle when the actual speed of a first dispense cycle is outside a threshold value of the base speed.

13. The soap, sanitizing or lotion dispenser of claim 12 wherein the threshold is plus or minus about 5% of the base speed.

14. The soap, sanitizing or lotion dispenser of claim 10 wherein the pulse width modulation circuitry adjusts the pulse width when after a preselected number of dispenses of fluid.

15. The soap, sanitizing or lotion dispenser of claim 10 wherein the pulse width modulation circuitry adjusts the pulse width after a preselected time period has elapsed, wherein the preselected time period occurs after an immediate subsequent dispense.

16. The soap, sanitizing or lotion dispenser of claim 10 wherein the pulse width modulation circuitry adjusts the pulse width as a function of a preselected number of dispenses of fluid greater than 1 dispense of fluid and an elapsed time period greater than the time required to dispense an immediate subsequent dose of fluid.

17. The soap, sanitizing or lotion dispenser of claim 10 wherein the key comprises data indicative of the type of fluid in the container and wherein the processor sets the dispenser to operate for the type of fluid in the first container and prevents operation of the dispenser from operators with subsequent containers of fluid if the type of fluid is different than the first type of fluid.

18. A soap, sanitizer or lotion dispenser comprising:
a housing;
a receptacle for receiving a container;

a reservoir located below the receptacle;
the reservoir having an inlet opening;
the reservoir having an outlet opening;
wherein the reservoir is devoid of additional openings;
wherein the inlet and the outlet are offset from one another;
a pump;
the pump having an inlet connected to the reservoir outlet;
a motor coupled to the pump;
a power source;
wherein the reservoir is filled from a refill unit and wherein the pump draws fluid out of the reservoir;
wherein the reservoir is formed of a first portion that has a first annular wall and includes the inlet and a second portion that has a second annular wall and includes the outlet; and
wherein the first annular wall and the second annular wall connect to one another to form the reservoir.

19. The soap, sanitizer or lotion dispenser of claim 18 wherein the first portion and the second portion may be rotated to change the offset distance between the inlet and the outlet.

\* \* \* \* \*